United States Patent
McCrank et al.

(10) Patent No.: US 6,356,765 B1
(45) Date of Patent: Mar. 12, 2002

(54) METHOD AND APPARATUS FOR TRACKING SIGNALS

(75) Inventors: Christopher L. McCrank; Javier V. Magaña, both of Austin, TX (US)

(73) Assignee: Legerity, Inc., Austin, TX (US)

( * ) Notice: Subject to any disclaimer, the term of this patent is extended or adjusted under 35 U.S.C. 154(b) by 0 days.

(21) Appl. No.: 09/360,953

(22) Filed: Jul. 27, 1999

(51) Int. Cl.⁷ .................................. H04Q 7/20
(52) U.S. Cl. ................ 455/465; 455/414; 455/426; 455/462; 455/463; 455/465
(58) Field of Search ................. 455/414, 422, 455/424, 425, 426, 462, 463, 464, 465, 423, 67.1; 375/317, 334, 319

(56) References Cited

U.S. PATENT DOCUMENTS

| | | | | |
|---|---|---|---|---|
| 5,471,508 A | * | 11/1995 | Koslov | 375/344 |
| 5,764,689 A | * | 6/1998 | Walley | 375/206 |
| 5,812,522 A | * | 9/1998 | Lee et al. | 370/206 |
| 5,867,766 A | * | 2/1999 | Dinc et al. | 455/62 |
| 5,940,450 A | * | 8/1999 | Koslov et al. | 375/344 |
| 5,956,326 A | * | 9/1999 | Magana | 370/277 |
| 6,134,227 A | * | 10/2000 | Magana | 370/330 |
| 6,144,853 A | * | 11/2000 | Gentles et al. | 455/426 |
| 6,269,086 B1 | * | 7/2001 | Magana et al. | 370/280 |

* cited by examiner

*Primary Examiner*—Daniel Hunter
*Assistant Examiner*—Yemane Woldetatios
(74) *Attorney, Agent, or Firm*—Williams, Morgan & Amerson (57) ABSTRACT

In one aspect of the present invention, a method and apparatus are provided for tracking a plurality of frequency-shift-key modulated signals in a communications device. The method includes determining a first threshold value for a first input signal of the plurality of signals, comparing the first input signal to the first threshold value and providing a first output signal. The method includes determining a second threshold value for a second input signal of the plurality of signals, and retaining at least a portion of the first threshold value while determining the second threshold value.

22 Claims, 6 Drawing Sheets

METHOD AND APPARATUS FOR TRACKING SIGNALS

BACKGROUND OF THE INVENTION

1. Field of the Invention

The present invention relates generally to communications, and, more particularly, to a method and apparatus for tracking a plurality of signals received by a communications device.

2. Description of the Related Art

The telecommunications industry has undergone explosive growth over the past several years. A significant contribution to this growth has been the high demand for radio communication services, such as cordless telephone service, for example. Cordless telephones provide a greater flexibility to a user than traditional landline phones by allowing them to move freely, and not tethered to the landline telephone system.

A typical cordless telephone system includes at least one handset unit and a base unit. It is possible for a cordless telephone system to have a plurality of handset units, where each handset is capable of interfacing with a common base unit. One example of such a telephone system is the "Two Handset, One Base System" produced by Advanced Micro Devices. The base unit is coupled to a telephone line and includes an antenna, a transmitter, and a receiver for communicating via radio frequencies with the handset unit(s). A local power line generally supplies the power for the base unit. Each handset unit of the cordless telephone system includes a speaker and a microphone, and also an antenna, a transmitter and a receiver for likewise communications with the base unit.

Under normal operating conditions, a user is able to make calls using one of the handset units that interfaces with the base unit. The user is able to roam freely about the location to make and receive calls, as long as the user stays within the generally transmitting and receiving range of the base unit. In a two-handset, one base unit telephone system, for example, the two handset units link to the single base unit over a common frequency by communicating during complementary time slots. As there are two separate handset radio systems communicating with a single base radio system, the base radio must be able to track and accommodate variations in the received signal from each handset to provide a robust link. Generally, in a two-handset, one base unit telephone system, the base station receiver is time-multiplexed between two incoming handset signals. As such, there are two different handset received analog signals that a tracking slicer circuit of the base unit is required to track, where each signal may have its own offset, amplitude, and slope.

A tracking slicer circuit compares an analog input signal against a threshold value and generates a logic level signal that is suitable for input to a digital transceiver. For robust communication, the threshold value is not fixed; instead it tracks the center of the received signal. A slicing circuit with a single tracking threshold can track the two signals from the handset units, but when switching between the two handsets it needs time to train to the relevant handset signal anomalies before the slicing circuit produces reliable digital data. Data may be corrupted or lost if the signals are different, as can been seen in FIG. 1.

Figure 1:
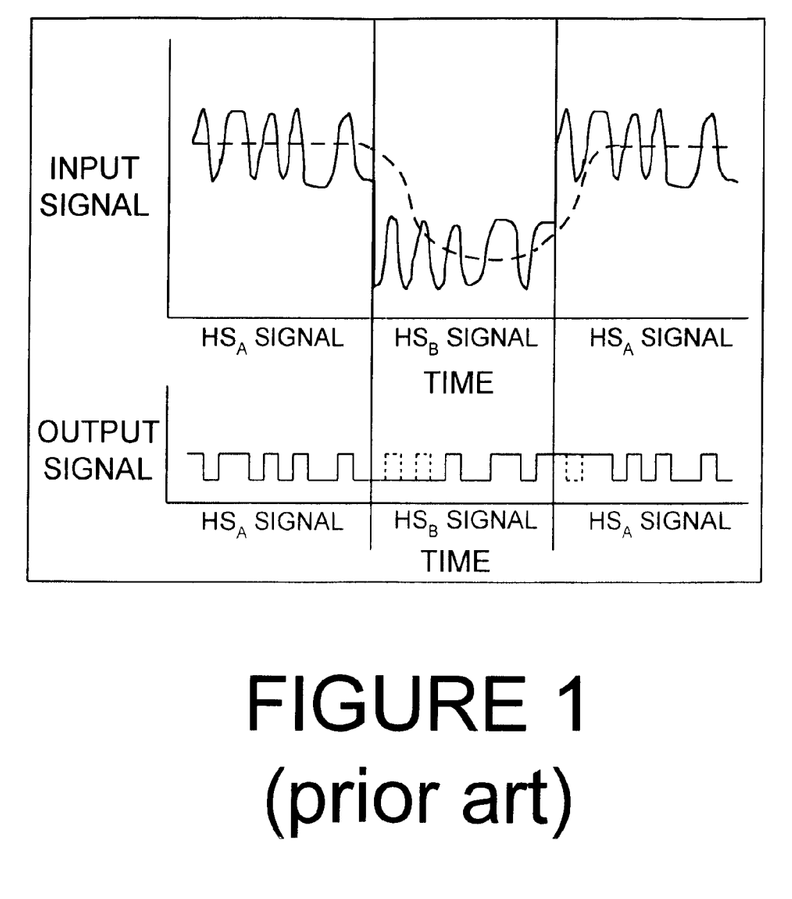
FIG. 1 shows an exemplary performance of a prior art tracking slicer circuit.

FIG. 1 shows an exemplary performance of the tracking slicer circuit with a frequency offset between the received handset unit signals. Specifically, FIG. 1 illustrates an input signal provided to the tracking slicer circuit and an output signal generated by the tracking slicer circuit in response to the input signal. The input signals are the signals received from the handset units over a span of three time slots. In the first time slot, the input signal shown is received from the first handset, and in the second time slot, the input signal shown is received from the second handset. The third time slot of the input signal represents the signal received from the first handset. FIG. 1 shows an offset between received signals from two Frequency-Shift Keying (FSK) Modulated handset units, a common occurrence in multi-handset unit, one base unit telephone systems. In the presence of frequency offsets or other variations between the signals from the handset units, the tracking slicer circuit may not be able to properly track the center frequency of both handset unit signals. For this reason, as shown in FIG. 1, at least a portion of the data in the output signal is corrupted.

The present invention is directed to overcoming, or at least reducing the effects of, one or more of the problems set forth above.

SUMMARY OF THE INVENTION

In one aspect of the present invention, a method is provided for tracking a plurality of signals in a communications device. The method includes determining a first threshold value for a first input signal of the plurality of signals and comparing the first input signal to the first threshold value to provide a first output signal. The method includes determining a second threshold value for a second input signal of the plurality of signals, and retaining at least a portion of the first threshold value while determining the second threshold value.

In another aspect of the present invention, an apparatus is provided for tracking a plurality of signals in a communications device. The apparatus includes a first tracking device, a comparator, and a second tracking device. The first tracking device is capable of determining a first threshold value for a first input signal of the plurality of signals. The comparator is capable of comparing the first input signal to the first threshold value and providing a first output signal. The second tracking device is capable of determining a second threshold value for a second input signal of the plurality of signals. The first tracking device is capable of retaining at least a portion of the first threshold value while determining the second threshold value.

BRIEF DESCRIPTION OF THE DRAWINGS

The invention may be best understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
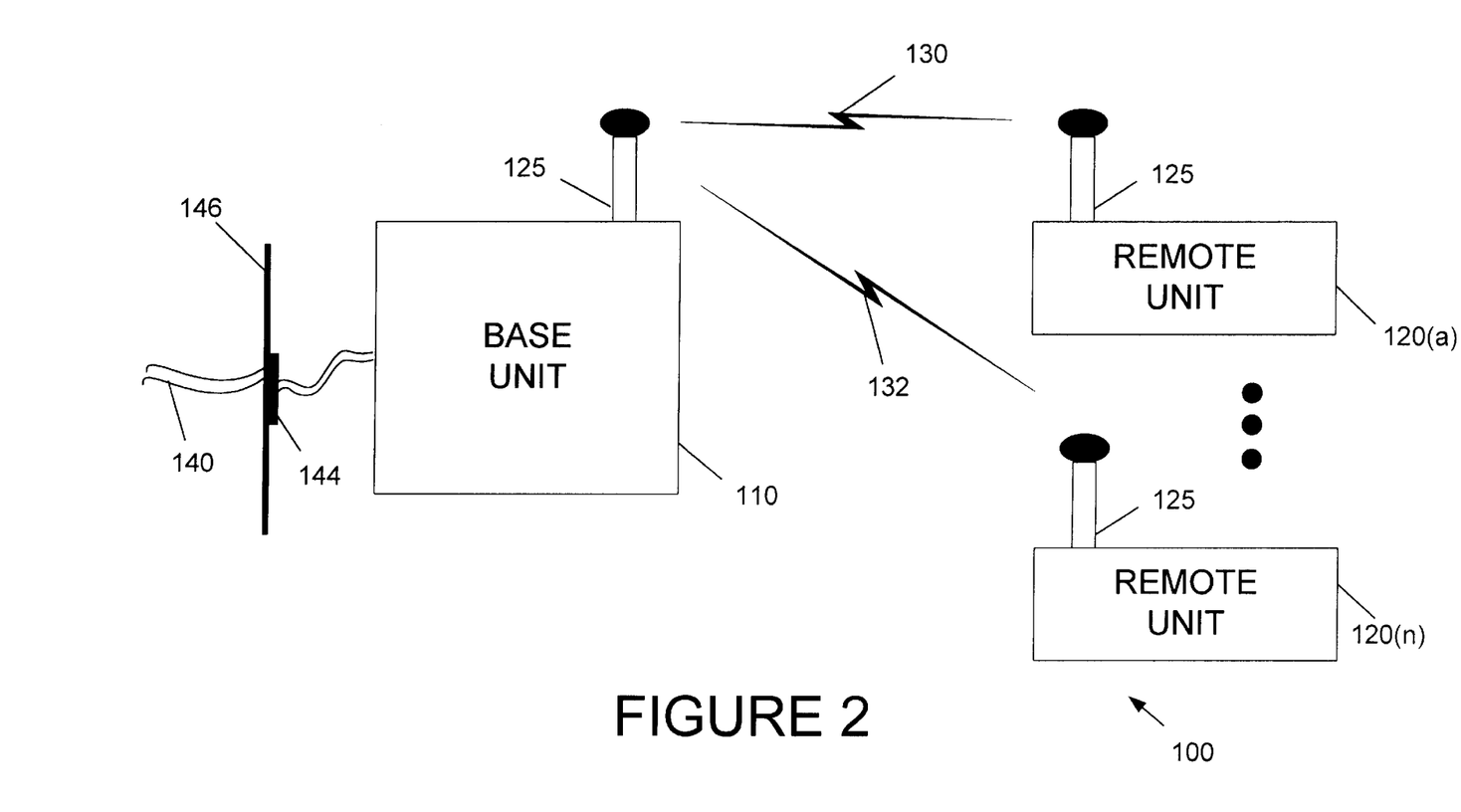
FIG. 2 is a simplified block diagram of a communications system including a base unit and a remote unit.

Turning now to the drawings, and specifically referring to FIG. 2, a simplified block diagram of a communications system 100 is shown in accordance with the present invention. The communications system 100 includes a base unit 110 and at least two remote units 120(a–n). An example of the communication system 100 is described in co-pending application Ser. No. 08/841,168, subject to common assignment, incorporated herein by reference in its entirety. For ease of illustration, the instant embodiment includes two remote units 120a, 120b. The base and remote units 110, 120a, 120b each include an antenna 125 for communication over a radio frequency (RF) link comprising 130 and 132. In the illustrated embodiment, the RF link 130 exemplifies a TDD/FDM communication scheme whereby transmit and receive frequencies, whose separation is based on a selected intermediate frequency (IF), occur over separate radio channels. In one embodiment, the communications system 100 is embodied as a digital cordless telephone system.

In accordance with the present invention, the base unit 110 is capable of concurrently interfacing with at least two remote units 120a, 120b over a common frequency pair using one radio transceiver by communicating during complementary time slots. In an alternative embodiment, the base unit 110 may interface with the remote units 120a, 120b over separate frequencies. The base unit 110 is coupled to an external line 140 via a telephone line interface 144 that is affixed to a fixed structure 146. The fixed structure 146, for example, may be a wall. The external line 140 may be a public switched telephone network (PSTN) line or a private branch exchange (PBX) line. The base unit 110 is coupled to the external line 140 to provide telephonic services to the remote unit 120.

In accordance with one embodiment, the remote unit 120a, 120b takes the form of a cordless handset, and includes conventional components (i.e., microphone, speaker, dial keypad, etc.) inherent to cordless phones. Such components are well known to those of ordinary skill in the art and are not discussed herein to avoid unnecessarily obscuring the present invention. The two remote units 120a, 120b are capable of communicating with the base unit 110 substantially simultaneously over a common frequency.

Figure 3:
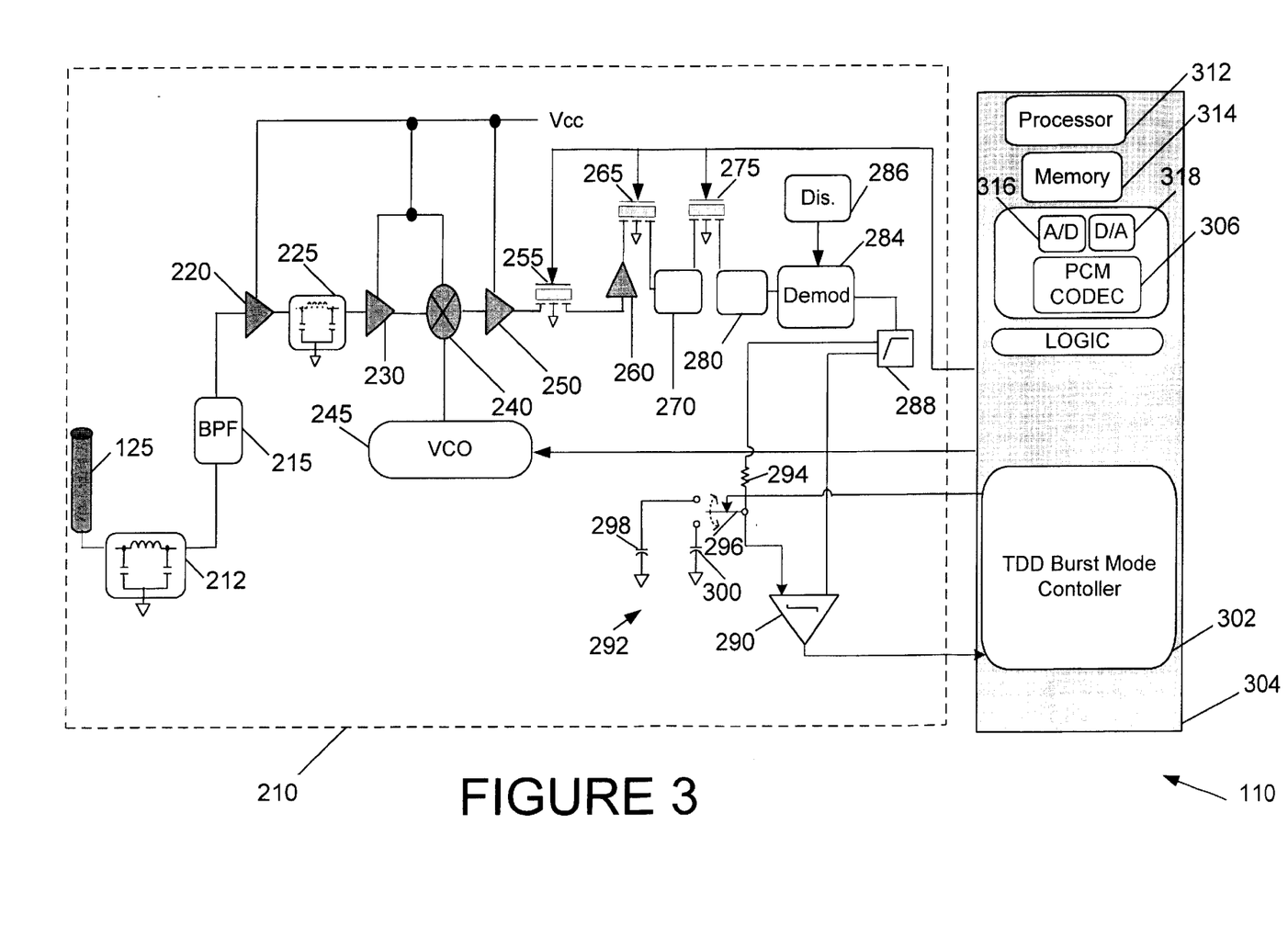
FIG. 3 illustrates a stylized block diagram of one embodiment of the base unit of FIG. 2.

Turning now to FIG. 3, a stylized block diagram of one embodiment of the base unit 110 in accordance with the present invention is shown. The remote unit 110 is capable of establishing a radio communication link with the remote units 120a, 120b. In the interest of clarity and to avoid obscuring the invention, only that portion of the base unit 110 that is helpful in understanding the invention is illustrated. More specifically, FIG. 3 illustrates a receive unit 210 of the base unit 110 that may be utilized for receiving signals from the remote units 120a, 120b. Those skilled in the art will appreciate that the base unit 110 may also include a transmitting unit (not shown), as well as other logic for implementing other telephonic features such as caller identification system, for example. The base unit 110 illustrated in FIG. 3 may employ time division duplex (TDD), frequency division duplex (FDD), or a combination thereof.

The base unit 110 interfaces with the remote units 120a, 120b over a common frequency by communicating during complementary time slots. The receive unit 210 is time-multiplexed between two incoming signals from the two remote units 120a, 120b. Thus, as the remote units 120a, 120b transmit information to the base unit 110, the receive unit 210 takes the incoming radio signal via the antenna 125 and provides it to a first impedance matching filter 212. The radio signal may comprise a plurality of signals, such as control signals, voice signals, and data signals transmitted by the remote units 120a, 120b. The first impedance matching filter 212 matches the Impedance of the antenna 125 with the impedance of the rest of the receiving unit 210, thereby reducing the signal reflection from the remaining portion of the receiving unit 210.

An output signal from the first impedance matching circuit 212 is provided to a first bandpass filter 215, which filters out the unwanted frequencies from the radio signal. The radio signal is then passed through a first amplifier 220, and subsequently through a second impedance matching filter 225. The second impedance matching filter 225 matches the output impedance of the first amplifier 220 to the impedance of the rest of the receiving unit 210. Although not so limited, in the illustrated embodiment, the first and second impedance matching filters 212, 225 have real 50-ohm impedance. Furthermore, in the illustrated embodiment, the center frequency of the first bandpass filter 215 is 900 MHz, and its bandwidth is approximately 2 MHz. Those skilled in the art will appreciate that the impedance of the impedance matching filters 212, 225, as well as the center frequency and bandwidth of the first bandpass filter 215, may vary, depending on the application in which they are employed.

The second impedance matching filter 225 provides an output signal to a second amplifier 230 and then to a mixer 240 (or downconverter). The mixer 240 mixes the signal from the second amplifier 230 with a signal generated by a local oscillator 245 and provides an intermediate frequency (IF) signal. The intermediate frequency signal is substantially equal to the difference between the radio frequency signal and the oscillator frequency generated by the local oscillator 245. In the illustrated embodiment, the local oscillator 245 is programmed to provide the transmit frequency. The IF signal from the mixer 240 is then provided to a third amplifier 250 and to a second bandpass filter 255. The output from the second bandpass filter 255 is amplified by a fourth amplifier 260, passed through a third bandpass filter 265, amplified by a first limiting amplifier 270, passed through a fourth bandpass filter 275, and then amplified by a second limited amplifier 280. In accordance with one embodiment of the present invention, the second, third, and fourth bandpass filters 255, 265, 275 are ceramic filters having a center frequency of approximately 10.7 MHz and a fixed bandwidth that allows either a single channel or a subset of channels to pass through.

The output signal from the second limited amplifier 280 is provided to a FSK demodulator 284, which generates an output voltage signal that is proportional to a plus and minus frequency deviation of the input signal. The demodulator 284 employs a discriminator 286 that allows the demodulator 284 to recover the information conveyed using frequency modulation. The output signal from the demodulator 284 is passed through a low pass filter 288, which substantially removes unwanted noise from the voltage signal resulting from the demodulation process provided by the demodulator 284. A first output terminal of the low pass filter 288 is coupled to a first input terminal of a comparator 290. The analog signal provided to the first input terminal of the comparator 290 comprises information (ie., voice, data, control signals, or the like) that is transmitted from the remote units 120a, 120b.

The receive unit 210 of the base unit 110 includes a tracking slicer circuit 292. The tracking slicer circuit 292 includes a resistor 294, a switch 296, and a first and second capacitor 298, 300. A first terminal of the resistor 294 is coupled to a second output terminal of the low pass filter 288 and a second terminal of the resistor 294 is coupled to the switch 296 that is controlled by a TDD burst mode controller (TBM controller) 302. The switch 296 connects the second terminal of the resistor 294 to either the first terminal of the first capacitor 298 or the first terminal of the second capacitor 300, depending on whether the signal received during a particular time slot is from the first or the second remote unit 120a, 120b. The switch 296 connects the second terminal of the resistor 294 to the first terminal of the first capacitor 298 for the time slots during which information is received from the first remote unit 120a. For the time slots during which information is received from the second remote unit 120b, the switch 296 connects the second terminal of the resistor 294 to the first terminal of the second capacitor 300. Although not so limited, in the illustrated embodiment, the receive unit 210 is time-multiplexed in a manner such that the signals from the first remote unit 120a are received during odd numbered time slots, and the signals from the second remote unit 120b are received during even numbered time slots. For example, information from the first remote unit 120a is received during a first time slot, information from the second unit 120b is received in a second time slot, information from the first remote unit 120a is received in a third time slot, and so forth.

The output signal from the switch 296 is provided to a second input terminal of the comparator 290. The signal that is provided to the second input terminal of the comparator 290 in the illustrated embodiment comprises substantially the center value (i.e., the threshold value) of the signal provided to the first input terminal of the comparator 290. This is because the voltage across the capacitors 298, 300 charges to substantially the center value of the analog signal that is provided to the first input terminal of the comparator 290. Accordingly, the comparator 290 compares the input signal from the first input terminal against the threshold value from the second input terminal and provides a substantially square output signal (i.e., a highs and lows) to the TBM controller 302 of the base unit 110.

The base unit 110 includes a controller 304 that controls a variety of functions of the base unit 110. In the instant embodiment, the controller 304 includes an ADPCM and PCM CODEC 306, a processor 312 for performing general functions, memory 314 for storing program information, and analog-to-digital converter and digital-to-analog converter 316, 318 for conversion of analog signals to digital signals, and vice-versa. The components of the controller 304 may be designed by one of ordinary skill having the benefit having of this disclosure. In one embodiment the controller 304 may provide fewer functions than the illustrated functions in FIG. 3, and in other embodiments it may provide additional functions not expressly illustrated in FIG. 3, such as caller identification system (not shown), for example.

Figure 4:
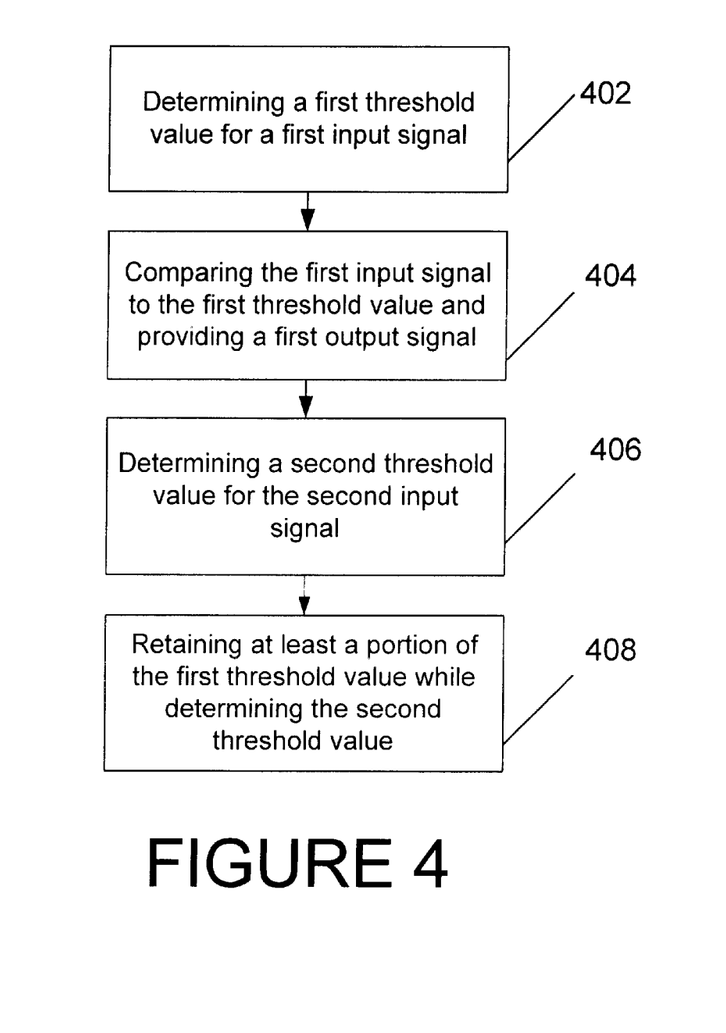
FIG. 4 illustrates one embodiment of a method in accordance with the present invention that may be implemented by the base unit of FIG. 3.

FIG. 4 illustrates a method in accordance with the present invention that may be employed by the base unit 110. The method begins at block 402, where tracking slicer circuit 292 receives a signal from the first remote unit 120a during a first time slot. For the time slots during which information is received from the first remote unit 120a, the TBM controller 302 directs the switch 296 to connect the second input terminal of the comparator 290 to the first capacitor 298. The signal from the second output terminal of the low pass filter 288 charges the first capacitor 298 through resistor 294 to a first threshold value during the first time slot. In the illustrated embodiment, the first threshold value is substantially the center value of the signal provided to the first input terminal of the comparator 290 during the given time slot. The first threshold value thus tracks the signal provided to the first input terminal of the comparator 290. The first threshold value is then provided to the second input terminal of the comparator 290. In this particular embodiment, the threshold value is provided to the comparator 290 as it tracks. In other embodiments, however, the tracking and comparing may occur during disjoint time slots.

At block 404, the comparator 290 compares the input signal from its first input terminal against the first threshold value from the second input terminal and provides a substantially square output signal (i.e., a highs and lows) to the TBM controller 302 of the base unit 110. At block 406, tracking slicer circuit 292 receives a signal from the second remote unit 120b during a second time slot. For the time slots during which information is received from the second remote unit 120b, the TBM controller 302 directs the switch 296 to connect the second input terminal of the comparator 290 to the second capacitor 300. The signal from the second output terminal of the low pass filter 288 charges the second capacitor 300 through resistor 294 to a second threshold value. In the illustrated embodiment, the second threshold value is substantially the center value of the signal provided to the first input terminal of the comparator 290 during the given time slot. The second threshold value thus tracks the signal provided to the first input terminal of the comparator 290. The second threshold value is then provided to the second input terminal of the comparator 290.

At block 408, the first capacitor 298 retains at least a portion of the first threshold value while the second capacitor 300 is charging to the second threshold value. As mentioned above, the switch 296 couples the second input terminal of the comparator 290 to the second capacitor 300 for the time slots during which information is received from the second remote unit 120b. While the second capacitor 300 charges to the second threshold value, the first capacitor 298 is isolated from the rest of the tracking slicer circuit 292. Accordingly, the first capacitor 298 retains at least a portion of the first threshold value until the signal from the first remote unit 120a requires tracking during the next time slot.

As mentioned earlier, the receive unit 210 of the base unit 110 time-multiplexes the received signals that are transmitted by the two remote units 120a, 120b. In the illustrated embodiment, the signals received from the two remote units 120a, 120b are received during complementary time slots (i.e., signals from the first remote unit 120a are received during odd-numbered time slots, and signals from the second remote unit 120b are received during even-numbered time slots). In accordance with the present invention, the first capacitor 298 retains at least a portion of the first threshold value during the time slots the second capacitor 300 is being charged to the second threshold value, and vice-versa. Thus, during the third time slot, because the first capacitor 298 retains at least a portion, if not all, of the first threshold value, the first capacitor 298 is able to reliably track the signal provided to the first input terminal of the comparator 290. During the third time slot, the second capacitor 300 is isolated from the tracking slicer circuit 292, thereby allowing the second capacitor 300 to retain at least a portion of the second threshold value until the fourth time slot. Thus, during the fourth time slot, because the second capacitor 300 retains at least a portion, if not all, of the second threshold value, the second capacitor 300 is able to reliably track the signal provided to the first input terminal of the comparator 290. Accordingly, the first capacitor 298 and the second capacitor 300 are able to track the respective first and second threshold values of the signals transmitted by the two remote units 120a, 120b during complementary time slots.

Figure 5:
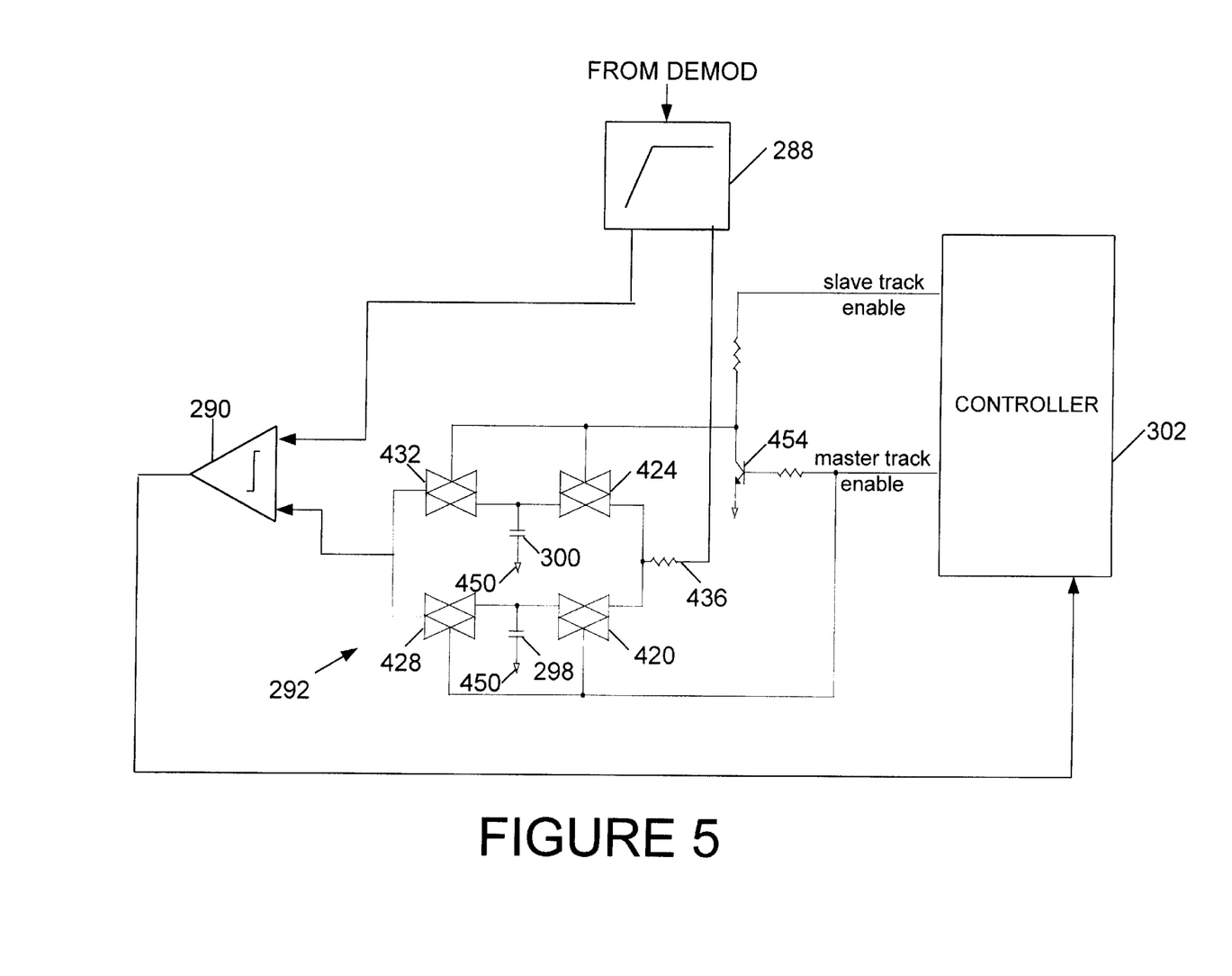
FIG. 5 depicts an alternative embodiment of a tracking circuit that may be employed in the base unit of FIG. 3.

FIG. 5 illustrates a block diagram of an alternative embodiment of the tracking slicer circuit 292 of FIG. 3 that may be employed in the base unit 10 of FIG. 3. The threshold circuit 292 of FIG. 5 includes first, second, third, and fourth solid state switches 420, 424, 428, 432 that are controlled by a master and slave enable signal provided by the TBM controller 302. As indicated by like numbering, the comparator 290, low pass filter 288, the first and second capacitors 298, 300, and TBM controller 302 are similar to those employed in the base unit 110 of FIG. 3. In the illustrated embodiment, the first output terminal of the low pass filter 288 is coupled to the first input terminal of the comparator 290, and the second output terminal of the low pass filter 288 is coupled to the first terminal of a resistor 436 of the tracking slicer circuit 292. The second terminal of the resistor 436 is coupled to first input terminals of the first and second switches 420, 424.

The tracking slicer circuit 292 includes the first capacitor 298, wherein a first terminal of the first capacitor 298 is coupled to a second terminal of the first switch 420 and to a first terminal of the third switch 428 and a second terminal of the first capacitor 298 is coupled to ground 450. A second terminal of the third switch 428 is coupled to a first input terminal of the fourth switch 432, as well as to the second input terminal of the comparator 290. A second capacitor 300 is coupled between ground 450 and a second input terminal of the fourth switch 432 and second input terminal of the second switch 424.

The tracking slicer circuit 292 of FIG. 5 operates functionally similar to the tracking slicer circuit 292 of FIG. 3. The master track enable signal controls the first and third switches 420, 428, and the slave track enable signal controls the second and fourth switches 424, 432. Generally, the master track enable signal is active during the time slots information is received from the first remote unit 120a, and the slave track enable signal is active during the time slots information is received from the second remote unit 120b. When the master track enable signal is active, the signal from the second output terminal of the low pass filter 288 charges the first capacitor 298 to the first threshold value. When the slave track enable signal is active, switches 420, 428 isolate the first capacitor 298 from the rest of the tracking slicer circuit 292, thereby preventing the first capacitor 298 from discharging. While the slave track signal is active, the signal from the second output terminal of the low pass filter 288 charges the second capacitor 300 to the second threshold value. Therefore, in accordance with the present invention, the first capacitor 298 retains at least a portion of the first threshold value during the time slots the second capacitor 300 is tracking the signal provided to the first input terminal of the comparator 290. Similarly, the second capacitor 300 retains at least a portion of the second threshold value during the time slots the first capacitor 298 is tracking the signal provided to the first input terminal of the comparator 290.

The tracking slicer circuit 292 includes a transistor 454 that prevents both the master and slave track enable signals from being active at substantially the same time. In the event both the master and slave track enable signals are active, the transistor 454 shorts the slave track enable signal to ground 450, thereby preventing the slave track enable signal from engaging the second and fourth switches 424, 432.

The resistor 436, along with the first and second capacitors 298, 300, determines the RC-time constant. As is described in more detail below, the first and second capacitors 298, 300 retain the threshold value for the received signals transmitted by the first and second remote units 120a, 120b, respectively. Although not so limited, in the illustrated embodiment, the resistor 436 is 10 K ohms, and each of the capacitors 298, 300 are 0.1 $\mu$F. In one embodiment, the threshold value may be adjusted by varying the size of the capacitors 298, 300. It is also envisioned that a variety of other charge retaining devices may be utilized in lieu of the capacitors 298, 300 without departing from the spirit and scope of the present invention. It is also envisioned that the embodiment depicted here can lend itself to circuit integration.

Figure 6:
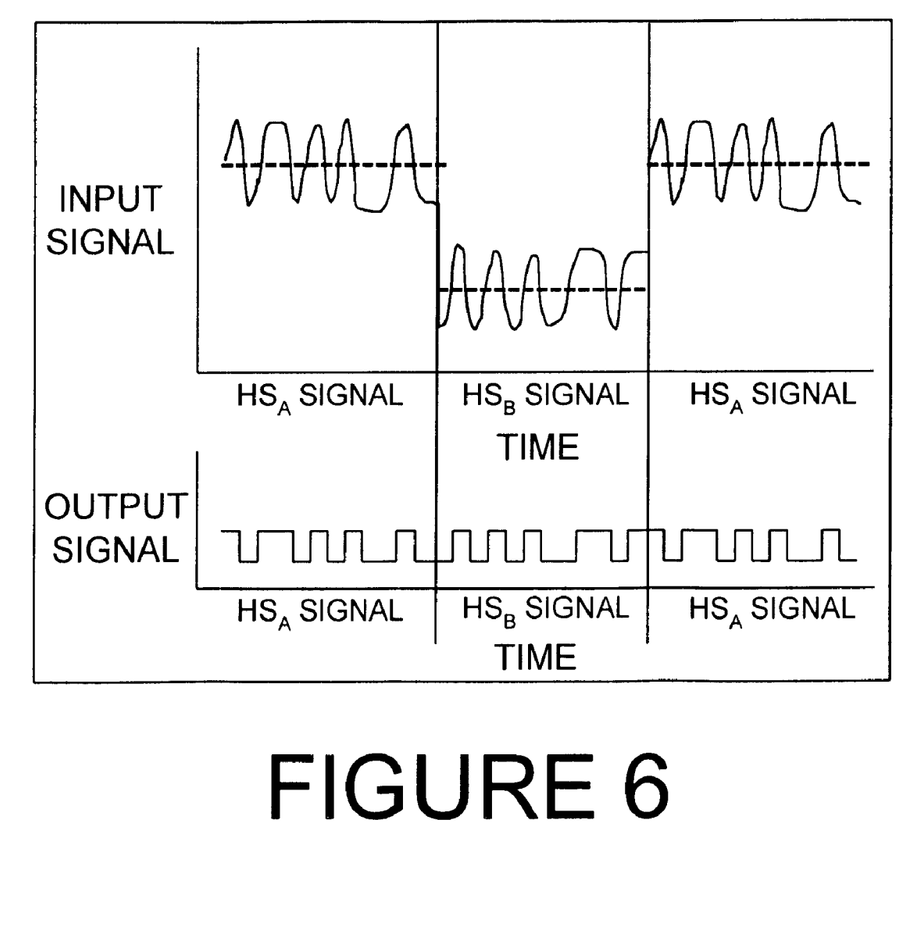
FIG. 6 shows an exemplary performance of a tracking slicer circuit in accordance with the present invention.

FIG. 6 illustrates an exemplary performance of the tracking slicer circuit 292 in accordance with the present invention. By tracking the signals from each remote unit 120a, 120b separately, the tracking slicer circuit 292 is able to account for frequency offsets or other variations that may be present between the transmitted signals of the two remote units 120a, 120b. Accordingly, as can be seen in FIG. 6, the present invention reduces data distortion that is otherwise present under prior art systems, as exemplified in FIG. 1.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for tracking a plurality of signals in a communications device, comprising:

determining a first threshold value for a first input signal of the plurality of signals;

comparing the first input signal to the first threshold value to provide a first output signal;

determining a second threshold value for a second input signal of the plurality of signals; and retaining at least a portion of the first threshold value while determining the second threshold value.

2. The method of claim 1, further including comparing the second input signal to the second threshold value to provide a second output signal.

3. The method of claim 2, wherein determining a first threshold value includes determining a center value of the first input signal.

4. The method of claim 3, wherein determining a second threshold value includes determining a center value of the second input signal.

5. The method of claim 4, further including retaining at least a portion of the second threshold value while determining the first threshold value.

6. A method for tracking a plurality of signals in a communications device, comprising:
   comparing a first input signal of the plurality of signals to a first threshold value to provide a first output signal;
   comparing a second input signal of the plurality of signals to a second threshold value to provide a second output signal; and
   retaining at least a portion of the first threshold value while comparing the second input signal to the second threshold value.

7. The method of claim 6, wherein determining a first threshold value includes determining a center value of the first input signal.

8. The method of claim 6, wherein determining a second threshold value includes determining a center value of the second input signal.

9. An apparatus for tracking a plurality of signals in a communications device, comprising:
   a first tracking device capable of determining a first threshold value for a first input signal of the plurality of signals;
   a comparator capable of comparing the first input signal to the first threshold value and providing a first output signal;
   a second tracking device capable of determining a second threshold value for a second input signal of the plurality of signals; and
   said first tracking device capable of retaining at least a portion of the first threshold value while determining the second threshold value.

10. The apparatus of claim 9, wherein the first tracking device capable of determining a first threshold value includes the first tracking device capable of determining a center value of the first input signal.

11. The apparatus of claim 10, wherein the second tracking device capable of determining a second threshold value includes the second tracking device capable of determining a center value of the second input signal.

12. The apparatus of claim 11, further including means for retaining at least a portion of the second threshold value while determining the first threshold value.

13. An apparatus for tracking a first and second input signal, comprising:
   a first tracking device capable of tracking a first threshold value of the first input signal;
   a second tracking device capable of tracking a second threshold value of the second input signal;
   a comparator having first and second input terminals, the first terminal adapted to receive at least one of the first and second input signals, the comparator capable of comparing signals from the first and second input terminals; and
   a circuit portion capable of delivering the first threshold value to the second terminal of the comparator during a first preselected time and the second threshold value to the second terminal of the comparator during a second preselected time.

14. The apparatus of claim 13, wherein the first tracking device is a capacitor capable of tracking the first input signal.

15. The apparatus of claim 14, wherein the first threshold value is substantially a center value of the first input signal.

16. The apparatus of claim 13, wherein the second tracking device is a capacitor capable of tracking the second input signal.

17. The apparatus of claim 16, wherein the second threshold value is substantially a center value of the second input signal.

18. The apparatus of claim 13, wherein the first and second input signals are a time-multiplexed signal, wherein the first preselected time and second preselected time correspond to complementary time slots of the time-multiplexed signal.

19. A telephone system, comprising:
   a first hand unit capable of delivering a first signal;
   a second hand unit capable of delivering a second signal; and
   a base unit capable of receiving the first signal and second signal, the base unit capable of:
      determining a first threshold value for the first signal;
      comparing the first input signal to the first threshold value and providing a first output signal;
      determining a second threshold value for a second input signal of the plurality of signals; and
      retaining at least a portion of the first threshold value while determining the second threshold value.

20. The apparatus of claim 19, wherein the base unit capable of determining a second threshold value includes the base unit capable of determining a center value of the second input signal.

21. The apparatus of claim 19, wherein the base unit capable of determining a second threshold value includes the base unit capable of determining a center value of the second input signal.

22. The apparatus of claim 19, further including the base unit capable of retaining at least a portion of the second threshold value while determining the first threshold value.

* * * * *